(12) United States Patent
Okamoto et al.

(10) Patent No.: US 10,770,907 B2
(45) Date of Patent: Sep. 8, 2020

(54) BATTERY DEVICE AND CONTROL METHOD THEREOF

(71) Applicants: KABUSHIKI KAISHA TOSHIBA, Tokyo (JP); TOSHIBA INFRASTRUCTURE SYSTEMS & SOLUTIONS CORPORATION, Kanagawa (JP)

(72) Inventors: Shinji Okamoto, Fuchu Tokyo (JP); Fumio Shibasaki, Tachikawa Tokyo (JP); Kazuo Shimizu, Akiruno Tokyo (JP); Takeshi Oosawa, Fuchu Tokyo (JP)

(73) Assignees: KABUSHIKI KAISHA TOSHIBA, Tokyo (JP); TOSHIBA INFRASTRUCTURE SYSTEMS & SOLUTIONS CORPORATION, Kanagawa (JP)

( * ) Notice: Subject to any disclaimer, the term of this patent is extended or adjusted under 35 U.S.C. 154(b) by 110 days.

(21) Appl. No.: 15/890,760

(22) Filed: Feb. 7, 2018

(65) Prior Publication Data

US 2018/0241224 A1    Aug. 23, 2018

(30) Foreign Application Priority Data

Feb. 23, 2017  (JP) ................................ 2017-032076

(51) Int. Cl.
*H02J 7/00*   (2006.01)
*G01R 31/3842*   (2019.01)
(Continued)

(52) U.S. Cl.
CPC ........ *H02J 7/0021* (2013.01); *G01R 31/3842* (2019.01); *G06F 13/16* (2013.01);
(Continued)

(58) Field of Classification Search
CPC .... H02J 7/0021; G01R 31/3842; G06F 13/16; H01M 10/425
(Continued)

(56) References Cited

U.S. PATENT DOCUMENTS

| | | | | |
|---|---|---|---|---|
| 2011/0068719 A1* | 3/2011 | Oya | .................... | H01M 2/1072 318/139 |
| 2011/0140533 A1* | 6/2011 | Zeng | .................... | H01M 10/425 307/80 |

(Continued)

FOREIGN PATENT DOCUMENTS

| | | |
|---|---|---|
| EP | 2840643 A1 | 2/2015 |
| EP | 3070823 A2 | 9/2016 |

(Continued)

OTHER PUBLICATIONS

Extended European Search Report dated May 22, 2018, mailed in counterpart European Application No. 18158087.9, 7 pages.

*Primary Examiner* — Zixuan Zhou
(74) *Attorney, Agent, or Firm* — Kim & Stewart LLP

(57) ABSTRACT

A battery device includes battery module, each including an assembled battery and a battery monitoring circuit. The assembled battery comprises battery cells. The battery monitoring circuit measures voltages of the battery cells, current and temperature levels of the assembled battery. A control circuit is connected to the battery monitoring circuits through a communication line and supplies power to the battery monitoring circuits. The control circuit communicates with the battery monitoring circuits through the communication line. Each battery monitoring circuit is configured to monitor signals transmitted on the communication line for a predetermined time period after its startup, and then to select a communication ID to one that does not conflict with any other ID used to communicate through the (Continued)

communication line during the predetermined time period. The selected ID is then transmitted on the communication line.

5 Claims, 2 Drawing Sheets

(51) Int. Cl.
  *H01M 10/42* (2006.01)
  *G06F 13/16* (2006.01)
  *H01M 10/052* (2010.01)

(52) U.S. Cl.
  CPC ........ *H01M 10/425* (2013.01); *H01M 10/052* (2013.01); *H01M 2010/4278* (2013.01); *H02J 2207/10* (2020.01)

(58) Field of Classification Search
  USPC .......................................... 320/134, 116–119
  See application file for complete search history.

(56) References Cited

U.S. PATENT DOCUMENTS

2014/0365792 A1* 12/2014 Yun ....................... G06F 1/3212
                                                      713/320
2017/0158059 A1    6/2017 Dai

FOREIGN PATENT DOCUMENTS

| JP | 2010533438 A | 10/2010 |
| JP | 2013070441 A | 4/2013 |
| JP | 2013109628 A | 6/2013 |
| WO | 200909390 A1 | 1/2009 |

* cited by examiner

BATTERY DEVICE AND CONTROL METHOD THEREOF

CROSS-REFERENCE TO RELATED APPLICATION

This application is based upon and claims the benefit of priority from Japanese Patent Application No. 2017-032076, filed Feb. 23, 2017, the entire contents of which are incorporated herein by reference.

FIELD

Embodiments described herein relate generally to a battery device and a control method of the battery device.

BACKGROUND

Battery devices may include multiple battery modules and a battery management circuit. For example, a battery device including lithium ion batteries has multiple battery modules, each of includes an assembled battery having multiple battery cells and a battery monitoring circuit. The battery monitoring circuit may be configured to supply power to the battery management circuit and to control operation of the battery management circuit.

The battery management circuit and the multiple battery monitoring circuits may each transmit various information based on a control area network (CAN) communication protocol. The battery monitoring circuits are each given unique IDs so as to identify the senders of various information during the communication based on the CAN communication protocol.

DETAILED DESCRIPTION

In a method in the related art to set IDs (identifiers) for distinguishing between the multiple battery monitoring circuits, an external device for setting the IDs may be connected to the multiple battery monitoring circuits. The external device respectively transmits a command to each battery monitoring circuits and sets the individual IDs in the battery monitoring circuits.

In another method in the related art, the IDs may be physically set in each of the multiple battery monitoring circuits by operation of ID setting structure, such as a DIP switch.

In yet another method in the related art, a dedicated communication interface may be provided to the battery management circuit and each of the multiple battery monitoring circuits. The multiple battery modules may be sequentially connected to a CAN communication line, and the IDs may be set by the order of the connection sequencing or some other parameter.

Setting the ID to each of the multiple battery monitoring circuits may take a substantial amount of time when the number of the battery modules is large because the ID setting work must be performed for each of the battery modules in turn. Adding a physical structure for setting IDs in the battery device increases the number of the parts of the battery device and thus can increase the size and cost of the battery device.

An example embodiment of the present disclosure provides a battery device capable of performing highly reliable communication between circuits and a control method of the battery device.

In general, according to one embodiment of the present disclosure, a battery device includes a plurality of battery modules, each battery module including an assembled battery and a battery monitoring circuit. The assembled batteries have battery cells. The battery monitoring circuit is configured to measure a voltage of the battery cells and a current of the assembled battery and a temperature of the assembled battery. A control circuit is connected to the battery monitoring circuits of the plurality of battery modules by a communication line and is configured to supply power to the battery monitoring circuits. Each battery monitoring circuit is configured to monitor signals transmitted on the communication line for a predetermined time period after its startup, and then set or select an ID for communication on the communication line that does not conflict with any ID used to communicate on the communication line. The battery monitoring circuit then transmits the selected ID to the control circuit via the communication line.

Figure 1:
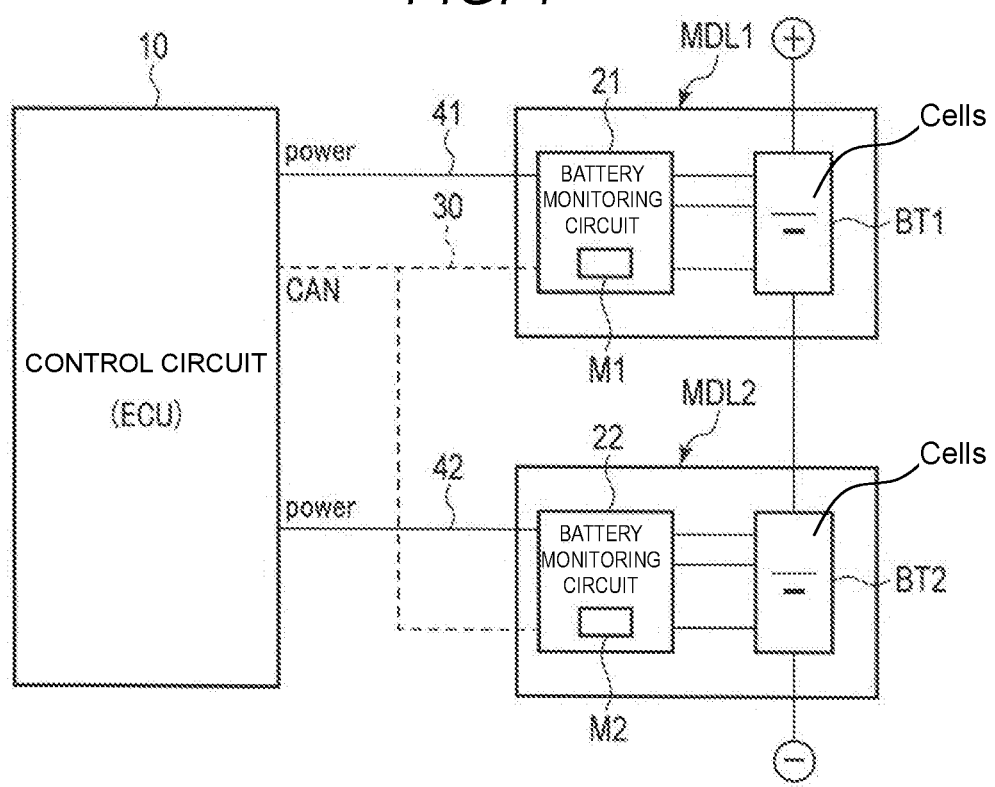
FIG. 1 is a block diagram schematically showing an example of a battery device according to an embodiment.

Hereinafter, a battery device and a control method will be described with reference to the drawings. FIG. 1 is a block diagram schematically showing a configuration example of a battery device according to an embodiment.

The battery device includes a control circuit 10 and battery modules MDL1 and MDL2. The control circuit 10 may also be referred to as and electrical control unit (ECU) in some instances. In this embodiment, a battery device including two battery modules MDL1 and MDL2 is used as an example for explanation. Additional battery modules may be incorporated in to the battery device.

The battery module MDL1 includes an assembled battery BT1 and a battery monitoring circuit 21, also referred to as a cell monitoring unit (CMU) in some instances. The battery module MDL2 includes an assembled battery BT2 and a battery monitoring circuit 22.

The assembled batteries BT1 and BT2 include, for example, two or more lithium ion battery cells ("Cells"). The assembled batteries BT1 and BT2 are, for example, electrically connected in series. The assembled battery BT1 has a positive electrode terminal that is electrically connectable to a main circuit positive potential terminal of the main circuit. The assembled battery BT2 has a negative electrode terminal that is electrically connectable to a main circuit negative potential terminal of the main circuit.

The battery monitoring circuits 21 and 22 electrically connect to the control circuit 10 through power lines 41 and 42, respectively, and each of the battery monitoring circuits 21 and 22 is started by a power source supplied from the control circuit 10. The battery monitoring circuits 21 and 22 measure voltages of the lithium ion battery cells in assembled batteries BT1 and BT2. The battery monitoring circuits 21 and also measure electric currents flowing in assembled batteries BT1 and BT2 by using current sensors. The battery monitoring circuits 21 and 22 further measure temperature in the proximity of their respective assembled batteries BT1 and BT2 by using temperature sensors.

The battery monitoring circuits 21 and 22 may be implemented by software or may be implemented by hardware, or may be implemented by using software and hardware in combination. The battery monitoring circuits 21 and 22 may each include at least one processor, such as a central processing unit (CPU) or a microprocessing unit (MPU), and may include respective memories M1 and M2. The battery monitoring circuits 21 and 22 can store IDs permitting communication based on a CAN protocol, in the respective memories M1 and M2. The battery monitoring circuit 21 or 22 can respectively set the ID that is stored in the memory M1 or M2.

The battery monitoring circuits 21 and 22 may also store IDs in the memories M1 and M2 that were set to perform communication in the past. The battery monitoring circuits 21 and 22 may also store candidates for the identifiers in advance as IDs that may be used to perform communication based on the CAN protocol.

The battery monitoring circuits 21 and 22 are connected to the control circuit 10 through a common communication line (CAN) 30, for example. The battery monitoring circuits 21 and communicate with the control circuit 10 through the communication line 30 based on the CAN protocol.

The control circuit 10 receives information of voltage, electric current, and temperature from the battery monitoring circuits 21 and 22 and calculates the state of charge SOC of each of the assembled batteries BT1 and BT2. The control circuit 10 may communicate with a host controller (not shown) and may transmit the state of charge SOC for the assembled batteries BT1 and BT2 and also the voltage, the electric current, and the temperature information, and/or other parameters that have been obtained from the battery modules MDL1 and MDL2 to the host controller.

The control circuit 10 may be implemented by software or may be implemented by hardware, or may be implemented by using software and hardware in combination. The control circuit 10 may include at least one processor (not shown), such as a CPU or an MPU, and a memory (not shown).

Figure 2:
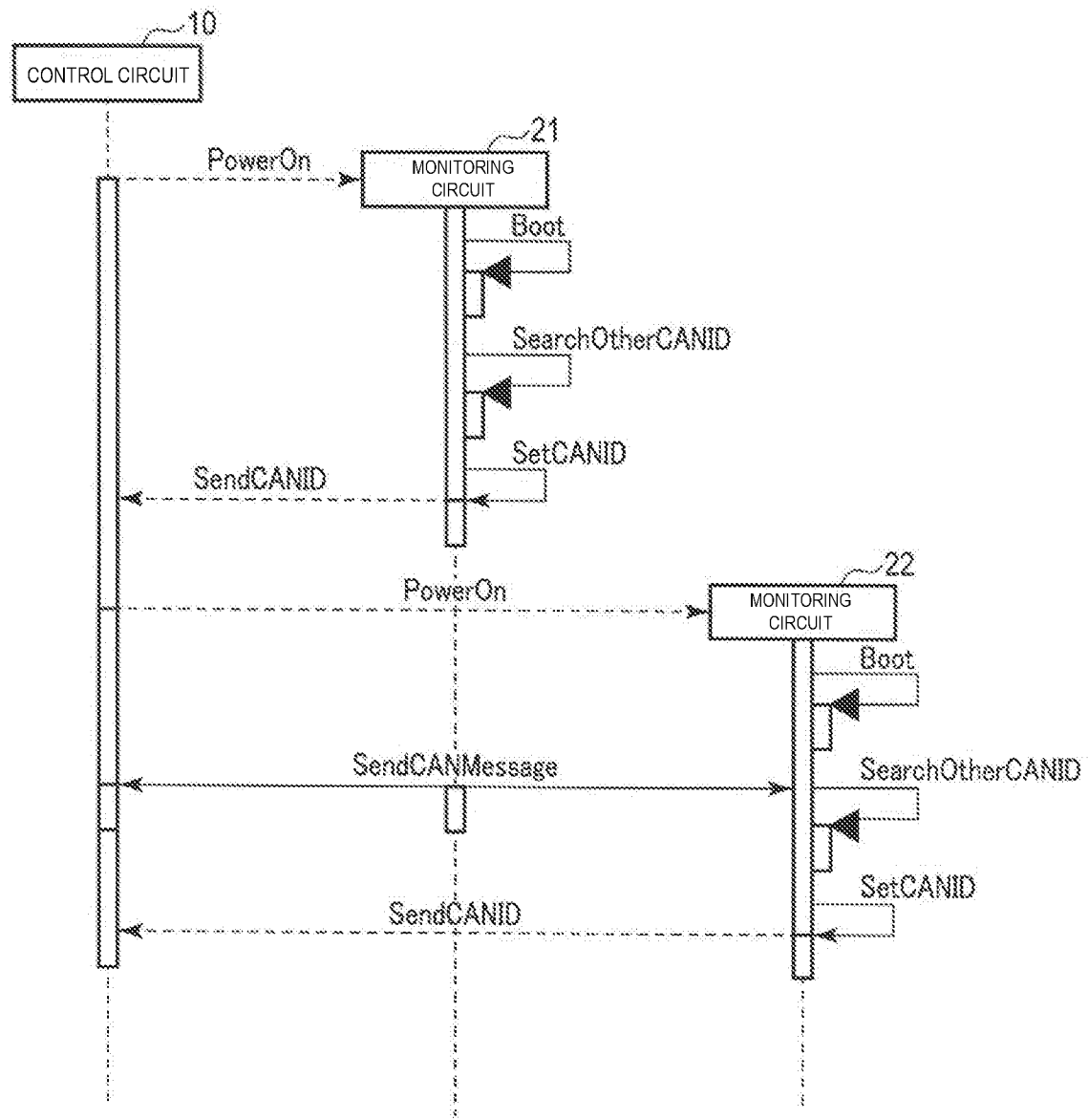
FIG. 2 is a sequence diagram for explaining an example of a control method of a battery device according to an embodiment.

FIG. 2 is a sequence diagram for explaining an example of a control method of a battery device according to an embodiment. Here, an operation for setting IDs to be used when the battery monitoring circuits 21 and 22 communicate using the CAN protocol will be explained.

The control circuit 10 starts the battery monitoring circuits 21 and 22 sequentially.

First, the control circuit 10 supplies a power source to the battery monitoring circuit 21 and thereby starts the battery monitoring circuit 21 (PowerOn).

The battery monitoring circuit 21 is started by the supplied power source (Boot) and confirms, for example, whether or not its own ID has been previously stored in the memory M1 and has been set, that is, whether an initialization is necessary. The battery monitoring circuit 21 may be configured to set its own ID every time at startup (PowerOn) regardless of the necessity for the initialization.

When its own ID is already set, that is, when the battery monitoring circuit 21 determines that the initialization is not necessary, the battery monitoring circuit 21 proceeds to measure voltage of the battery cells in the assembled battery BT1 and also the current and temperature of the assembled battery BT1. This information is then output to the communication line 30 along with the set ID.

When its own ID has not yet been set, that is, when the battery monitoring circuit 21 determines that the initialization is necessary, the battery monitoring circuit 21 monitors the signals that are transmitted through the communication line 30 for a predetermined time period. The time period for which the battery monitoring circuit 21 monitors the signals should be longer than one communication cycle between the other battery monitoring circuit 22 and the control circuit 10. For example, the time period may be set at 100 milliseconds (ms). The length of the communication cycle between the battery monitoring circuit 22 and the control circuit 10 differs depending on the configurations of the battery device and the host device incorporating the battery device, and therefore, the monitoring time period for the battery monitoring circuit 21 can be adjusted accordingly.

The battery monitoring circuit 21 monitors the signals transmitted through the communication line 30 and obtains IDs that are presently being used by other circuits, such as the control circuit 10 and the other battery monitoring circuit 22 (SearchOtherCANID).

The battery monitoring circuit 21 then sets an ID that does not overlap the IDs being used by the other circuits as its ID (SetCANID). When its previously set ID (an ID that was used in the past and currently stored in the built-in memory M1) is available (that is, is apparently not being used by another circuit at present), the battery monitoring circuit 21 may preferentially select this ID as its current ID for communication.

After setting its ID, the battery monitoring circuit 21 sends the set ID to the communication line 30 (SendCANID). The control circuit 10 receives this ID through the communication line 30 and stores this ID as the ID of the battery monitoring circuit 21 in a memory, for example.

After setting its ID, the battery monitoring circuit 21 measures the voltage of the battery cells of the assembled battery BT1 and the current and temperature of the assembled battery BT1 and then outputs this information, along with its ID, to the communication line 30.

Subsequently, the control circuit 10 supplies a power source to the battery monitoring circuit 22 and starts the battery monitoring circuit 22 (PowerOn).

The battery monitoring circuit 22 is started by the supplied power source (Boot) and then confirms, for example, whether its ID for the CAN communication has been stored in the memory M2 and set, that is, whether an initialization is necessary.

When its ID has already been set, that is, when the battery monitoring circuit 22 determines that initialization is not necessary, the battery monitoring circuit 22 measures voltage of the battery cells of the assembled battery BT2 and current and temperature of the assembled battery BT2 and outputs information, such as the voltage, the current, and the temperature, along with its set ID to the communication line 30.

When the ID has not yet been set, that is, when the battery monitoring circuit 22 determines that initialization is necessary, the battery monitoring circuit 22 monitors signals that are transmitted being through the communication line 30 for a predetermined time period. The time period for which the battery monitoring circuit 22 monitors the signals should be longer than a communication cycle between the other battery monitoring circuit 21 and the control circuit 10. For example, the time period may be set at 100 ms. The length of the communication cycle between the battery monitoring circuit 21 and the control circuit 10 may differ depending on the configurations of the battery device and the host device incorporating the battery device, and therefore, the length of the monitoring time period may be adjusted accordingly.

The battery monitoring circuit 22 monitors the signals being transmitted through the communication line 30 and obtains IDs that are presently being used by the other circuits, such as the control circuit 10 and the other battery monitoring circuit 21 (SearchOtherCANID). For example, when the battery monitoring circuit 21 outputs various information to the communication line 30 (SendCANMessage), the battery monitoring circuit 22 receives this various information and the accompanying ID and thus obtains the ID being currently used by the battery monitoring circuit 21.

The battery monitoring circuit 22 sets an ID that does not conflict with the IDs being used by the other circuits, as its own ID (SetCANID). The battery monitoring circuit 22 may preferentially set its ID to one that was used in the past and is stored in the memory M2 when that ID is available.

After setting its ID, the battery monitoring circuit 22 sends the set ID to the communication line 30 (SendCANID). The control circuit 10 receives this ID through the communication line 30 and stores the ID as the ID of the battery monitoring circuit 22 in a memory, for example.

After setting its ID, the battery monitoring circuit 22 measures voltage of the battery cells of the assembled battery BT2 and current and temperature of the assembled battery BT2 and outputs this information, along with its ID to the communication line 30.

As described above, the control circuit 10 starts the battery monitoring circuits 21 and 22 in sequence and by this process sets IDs to be used by the respective battery monitoring circuits 21 and 22 in the CAN communication. Consequently, the control circuit 10 can identify (by the set IDs) the particularly sender of the information transmitted through the communication line 30.

According to this embodiment, the control circuit 10 sequentially starts the battery monitoring circuits 21 and 22, which automatically sets IDs of the respective battery monitoring circuits 21 and 22. This arrangement requires no repetition of the work even when the number of the battery modules is large and also enables ending of the work in a short time.

According to this embodiment, there is no need to add a physical structure to the battery device for setting IDs, thereby limiting the number of the parts in the battery device and preventing an increase in the size and/or cost of the battery device.

In the battery device of this example embodiment, the battery monitoring circuits 21 and 22 select and set their own IDs to be used in communication, thereby decreasing the processing steps performed by the control circuit 10. This embodiment provides a battery device capable of performing highly reliable communication between circuits and provides a control method of the battery device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A battery device, comprising:
a first battery module including a first battery monitoring circuit and a first assembled battery, the first battery monitoring circuit configured to measure current, voltage, and temperature in the first battery module;
a second battery module including a second battery monitoring circuit and a second assembled battery, the second battery monitoring circuit configured to measure current, voltage, and temperature in the second battery module, the first and second assembled battery being electrically connected to each other in series between a positive load terminal and negative load terminal; and
a control circuit connected to the first and second battery modules by a communication line and configured to receive information from the first and second battery monitoring circuits via the communication line, wherein
the first battery monitoring circuit is configured to monitor signals transmitted on the communication line for a predetermined time period after a startup of the first battery monitoring circuit and to detect communication IDs presently being used by another battery module for communications to the control circuit through the communication line during the predetermined period of time and then select a communication ID for transmissions of information to the control circuit that does not conflict with any detected communication ID, and then send the selected ID to the control circuit via the communication line.

2. The battery device according to claim 1, wherein the second battery monitoring circuit is configured to monitor communications occurring on the communication line for a predetermined period of time after a startup of the second battery monitoring circuit and to detect communication IDs presently being used for communications on the communication line during the predetermined period of time and then select a communication ID for transmissions of information to the control circuit that does not conflict with any communication ID used during the predetermined period of time and then send the selected ID to the communication line.

3. A control method of a battery device including a control circuit connected to a plurality of battery monitoring circuits via a communication line, the method comprising:
starting a first battery monitoring circuit upon being supplied with power by a control circuit;
with the first battery monitoring circuit, monitoring communication signals transmitted through a communication line for a predetermined period after starting of the first battery monitoring circuit to detect communication IDs presently being used by another battery monitoring circuit for communications to the control circuit through the communication line during the predetermined period;
with the first battery monitoring circuit, selecting a communication ID that does not conflict with any detected communication ID; and
transmitting information from the first battery monitoring circuit to the control circuit through the communication line using the selected communication ID.

4. The control method according to claim 3, further comprising:
notifying the control circuit of the selection of the communication ID via the communication line.

5. The control method according to claim 3, wherein the first battery monitoring circuit includes a non-volatile memory storage in which a previously selected communication ID is stored before startup, and the first battery monitoring circuit preferentially selects the previously selected communication ID stored in the non-volatile memory when it does not conflict with any of the detected communication IDs.

* * * * *